(12) United States Patent
Jodka et al.

(10) Patent No.: US 11,056,966 B2
(45) Date of Patent: Jul. 6, 2021

(54) PROCESS OF OPERATING SWITCHED-MODE DC/DC CONVERTER HAVING A BOOTSTRAPPED HIGH-SIDE DRIVER

(71) Applicant: TEXAS INSTRUMENTS INCORPORATED, Dallas, TX (US)

(72) Inventors: Eduardas Jodka, Freising (DE); Julian Becker, Freising (DE); Carsten Stoerk, Freising (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/996,259

(22) Filed: Aug. 18, 2020

(65) Prior Publication Data

US 2020/0381990 A1 Dec. 3, 2020

Related U.S. Application Data

(62) Division of application No. 16/265,478, filed on Feb. 1, 2019, now Pat. No. 10,784,764.

(51) Int. Cl.
*H03K 99/00* (2013.01)
*H02M 1/08* (2006.01)
*H03K 17/687* (2006.01)
*H02M 3/155* (2006.01)
*H02M 1/00* (2006.01)

(52) U.S. Cl.
CPC ............. *H02M 1/08* (2013.01); *H02M 3/155* (2013.01); *H03K 17/687* (2013.01); *H02M 2001/0048* (2013.01); *H03K 2217/0063* (2013.01); *H03K 2217/0072* (2013.01)

(58) Field of Classification Search
CPC ................... H02M 1/08; H02M 3/155; H02M 2001/0048; H03K 17/687; H03K 2217/0063; H03K 2217/0072
See application file for complete search history.

(56) References Cited

U.S. PATENT DOCUMENTS

| 5,914,867 | A | 6/1999 | Pascucci |
| 5,952,851 | A * | 9/1999 | Yuen ................ H03K 19/01714 326/83 |
| 7,183,814 | B2 | 2/2007 | Kudo |
| 9,379,696 | B2 | 6/2016 | Kuo |

(Continued)

*Primary Examiner* — Dinh T Le
(74) *Attorney, Agent, or Firm* — Lawrence J. Bassuk; Charles A. Brill; Frank D. Cimino

(57) ABSTRACT

A gate driver for a high-side NMOS power transistor in a DC/DC boost converter includes first and second switches coupled in series between an output pin and the gate of the high-side transistor. A third switch is coupled between the gate and a switch-node between the high-side and low-side transistors, the switch node also being coupled to an input pin. Fourth and fifth switches are coupled in series between the output pin and a clamp pin. Sixth and seventh switch are coupled in series between the output pin and a ground pin. First and second bootstrap capacitors have respective first terminals coupled to a first node between the first and second switches. The first capacitor has a second terminal coupled to a node between the fourth and fifth switches; the second capacitor has a second terminal coupled to a node between the sixth and seventh switches.

15 Claims, 7 Drawing Sheets

(56) References Cited

U.S. PATENT DOCUMENTS

| | | |
|---|---|---|
| 9,680,377 B2 * | 6/2017 | Zhang .................... H02M 1/08 |
| 2016/0065072 A1 | 3/2016 | Xiu |
| 2017/0054369 A1 | 2/2017 | Chin |
| 2018/0294716 A1 | 10/2018 | Ramalingam |

* cited by examiner

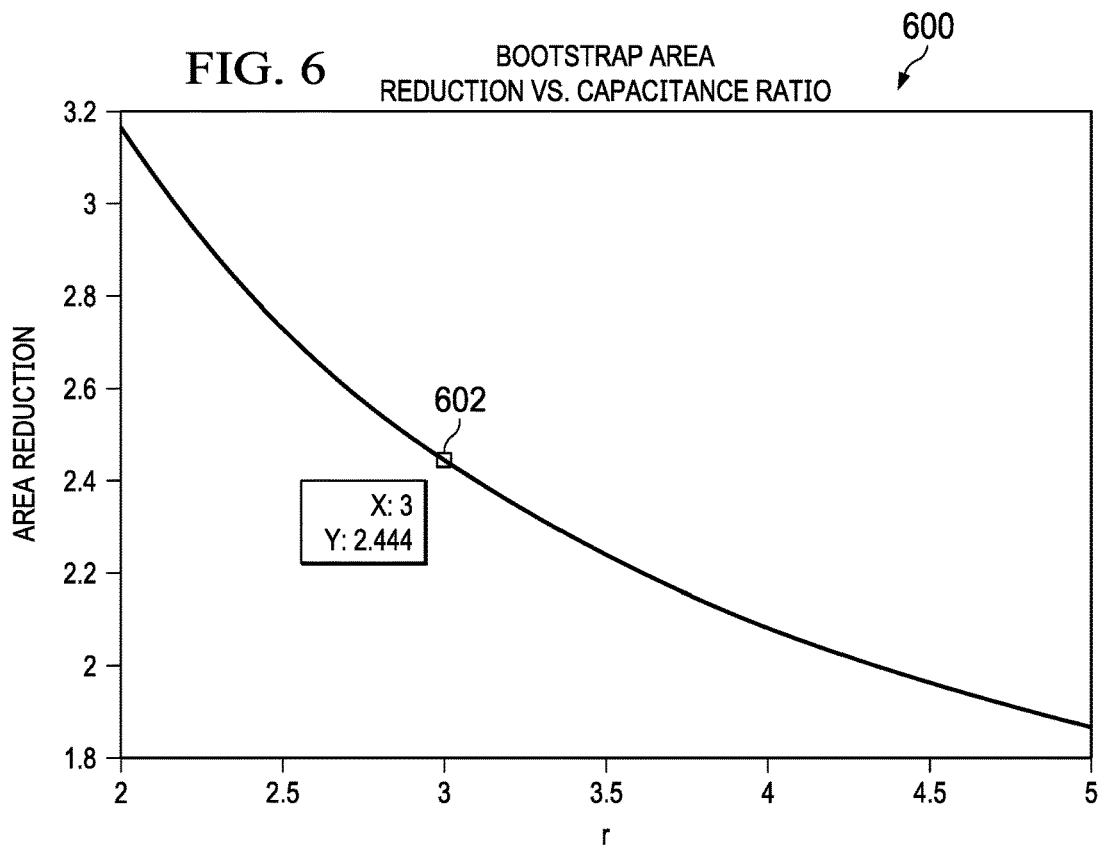
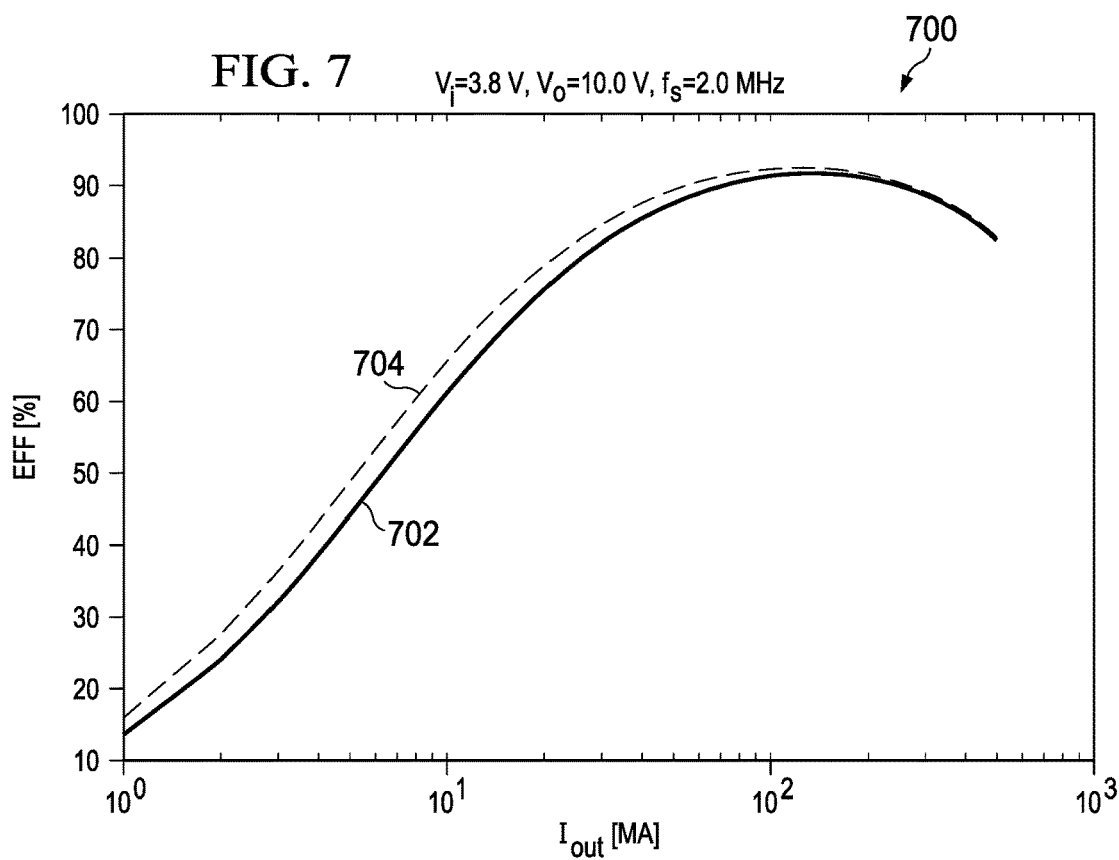

PROCESS OF OPERATING SWITCHED-MODE DC/DC CONVERTER HAVING A BOOTSTRAPPED HIGH-SIDE DRIVER

This application is a divisional of prior application Ser. No. 16/265,478, filed Feb. 1, 2019, now U.S. Pat. No. 10,784,764, issued Sep. 22, 2020.

FIELD OF THE DISCLOSURE

Disclosed embodiments relate generally to the field of voltage conversion circuits. More particularly, and not by way of any limitation, the present disclosure is directed to a switched-mode DC/DC converter having a bootstrapped high-side driver.

BACKGROUND

In the power stage of a DC/DC boost converter two N-type metal oxide silicon (NMOS) transistors can be employed as low-side and high-side switches. This arrangement implies a bootstrapped gate-driver for the high-side switch. In order to create a stable bootstrap voltage a large capacitor is typically needed. Use of a large capacitor can be area-costly and introduces additional switching losses that reduce converter efficiency. Improvements are desirable.

SUMMARY

Disclosed embodiments provide a switched-mode DC/DC boost converter using stacked bootstrap capacitors that can be charged to different bootstrap voltages. Stacked bootstrap capacitors reduce the area required and may provide additional advantages as will be discussed.

In one aspect, an embodiment of a gate driver for a high-side NMOS power transistor in a DC/DC boost converter that is implemented in an IC chip is disclosed. The gate driver includes a first switch coupled in series with a second switch between an output pin for coupling to an output voltage and a gate of the high-side NMOS power transistor; a third switch coupled between the gate of the high-side NMOS power transistor and a switch-node, the switch-node being located between the high-side NMOS power transistor and a low-side NMOS power transistor and being further coupled to an input pin; a fourth switch coupled in series with a fifth switch between the output pin and a clamp pin for coupling to a clamping voltage; a sixth switch coupled in series with a seventh switch between the output pin and a ground pin for coupling to a lower rail; a first bootstrap capacitor having a first terminal coupled to a first node between the first switch and the second switch and a second terminal coupled to a second node between the fourth switch and the fifth switch; and a second bootstrap capacitor having a first terminal coupled to the first node and a second terminal coupled to a third node between the sixth switch and the seventh switch.

In another aspect, an embodiment of a DC/DC boost converter implemented in an IC chip is disclosed. The DC/DC boost converter includes a high-side N-type metal oxide silicon (NMOS) power transistor coupled in series with a low-side NMOS power transistor between an output pin for coupling to an output voltage and a ground pin for coupling to a lower rail; a switch-node located between the high-side NMOS power transistor and the low-side NMOS power transistor, the switch-node being coupled to an input pin for coupling to an input voltage through an inductor; a first bootstrap capacitor having a first terminal coupled to be selectively connected to one of an output voltage and a gate of the high-side NMOS power transistor and a second terminal coupled to be selectively connected to one of a clamp pin for coupling to a clamping voltage and the output pin; and a second bootstrap capacitor having a first terminal coupled to be selectively connected to one of the output pin and the gate of the high-side NMOS power transistor and a second terminal coupled to be selectively connected to one of the ground pin and the output pin.

In yet another aspect, an embodiment of a method of operating a DC/DC boost converter is disclosed. The method includes providing the DC/DC boost converter on an integrated circuit (IC) chip, the DC/DC boost converter comprising stacked bootstrap capacitors; and coupling an output pin of the IC chip to provide an output voltage, wherein the output pin is coupled to respective first terminals of the stacked bootstrap capacitors during a first phase and to respective second terminals of the stacked bootstrap capacitors during a second phase.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

FIG. 6 depicts a graph of the relationship between the capacitance ratio of bootstrap capacitor C2 to bootstrap capacitor C1 and how many times smaller the stacked capacitor implementation is than the single capacitor implementation;

FIG. 7 depicts the overall boost converter efficiency for a single bootstrap capacitor implementation versus the stacked bootstrap capacitor implementation;

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 9:
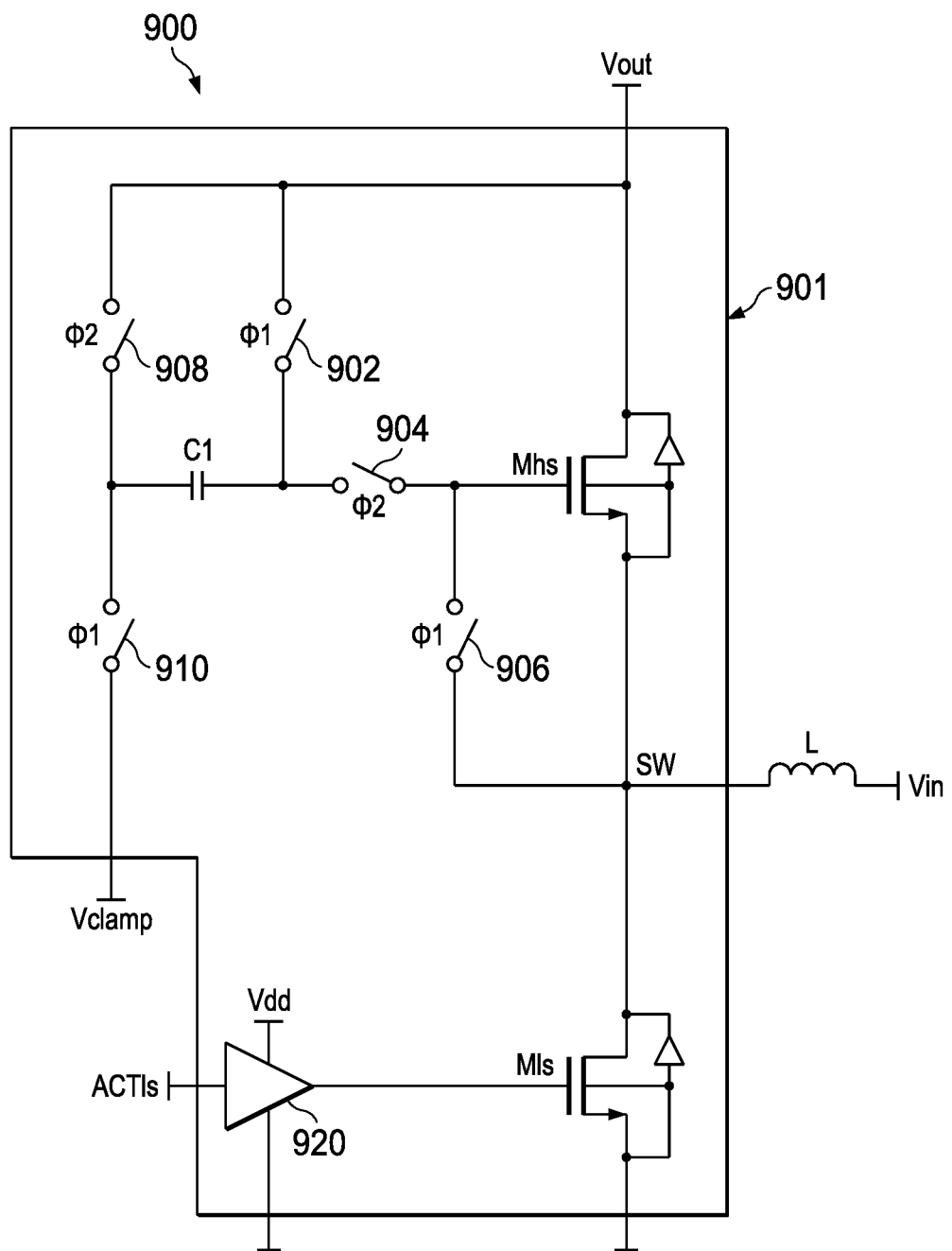
FIG. 9 depicts an example of a switched-mode DC/DC boost converter according to the prior art.

A prior art DC/DC boost converter 900 having an output voltage Vout of up to 10 V is shown in FIG. 9. DC/DC boost converter 900 is implemented on an integrated circuit (IC) chip 901 that can be coupled to a first terminal of an inductor L, with input voltage Vin coupled to the second terminal of inductor L. DC/DC boost converter 900 is also coupled to output voltage Vout and to a lower rail, which can be a ground plane. Bootstrap capacitor C1 is provided on-chip and in the embodiment shown, the technology used to manufacture IC chip 901 is only able to handle a voltage across bootstrap capacitor C1 of 5 V. Because a first terminal of bootstrap capacitor C1 is coupled to output voltage Vout, which can have a value of up to 10 V, a clamping voltage Vclamp can be coupled to a second terminal of bootstrap capacitor C1 in order to limit the voltage across bootstrap capacitor C1. Hence, in the case where output voltage Vout is 10 V, clamping voltage Vclamp is 5 V.

DC/DC boost converter 900 contains a high-side NMOS power transistor Mhs that is coupled in series with a low-side NMOS power transistor Mls between the output voltage Vout and the lower rail. Switch-node SW is located between high-side NMOS power transistor Mhs and low-side NMOS power transistor Mls and can be coupled to inductor L to receive input voltage Vin. Control of low-side NMOS power transistor Mls is generally easier than control of high-side NMOS power transistor Mhs and is shown simply as driver circuit 920, which is coupled to voltage Vdd and to the lower rail and which receives an activation signal ACTls.

The driver circuit for high-side NMOS power transistor Mhs includes a bootstrap capacitor C1 and five switches 902-910. These switches are shown in their most generic form because the exact implementation of the switches is not relevant to the disclosure. A first terminal of bootstrap capacitor C1 is coupled to switch 902, which operates to couple the terminal to output voltage Vout. The first terminal is also coupled to switch 904, which operates to couple the first terminal to the gate of high-side NMOS power transistor Mhs. The gate of high-side NMOS power transistor Mhs is additionally coupled to switch 906, which operates to couple the gate to switch-node SW. The second terminal of bootstrap capacitor C1 is coupled to switch 908, which operates to couple the second terminal to output voltage Vout, and is also coupled to switch 910, which operates to couple the second terminal to clamping voltage Vclamp.

Switches 902-910 are operated in two phases, with the phase in which the switch is coupled to be closed shown in FIG. 9. In a first phase Φ1 that occurs when low-side NMOS power transistor Mls is on, switches 902, 906 and 910 are closed while switches 904 and 908 are open. Bootstrap capacitor C1 is charged to a bootstrap voltage Vboot1 that is equal to output voltage Vout minus clamping voltage Vclamp, which in one embodiment is 5 V. At the same time, the gate of high-side NMOS power transistor Mhs is coupled to switch-node SW through switch 906. Because the gate and the source terminals of the power transistor are thus at the same potential, high-side NMOS power transistor Mhs is maintained in an off state.

In a second phase 12, low-side power transistor Mls is turned off, switches 902, 906 and 910 are opened and switches 904 and 908 are closed. The second terminal of bootstrap capacitor C1 now receives output voltage Vout. The charge accumulated during the first phase Φ1 is shared with the gate capacitor of high-side NMOS power transistor Mhs, creating a gate-source voltage and turning on high-side NMOS power transistor Mhs. As previously mentioned, integrated bootstrap capacitor C1 can occupy an extensive area on IC chip 901 and introduce additional switching losses that reduce converter efficiency.

Figure 1:
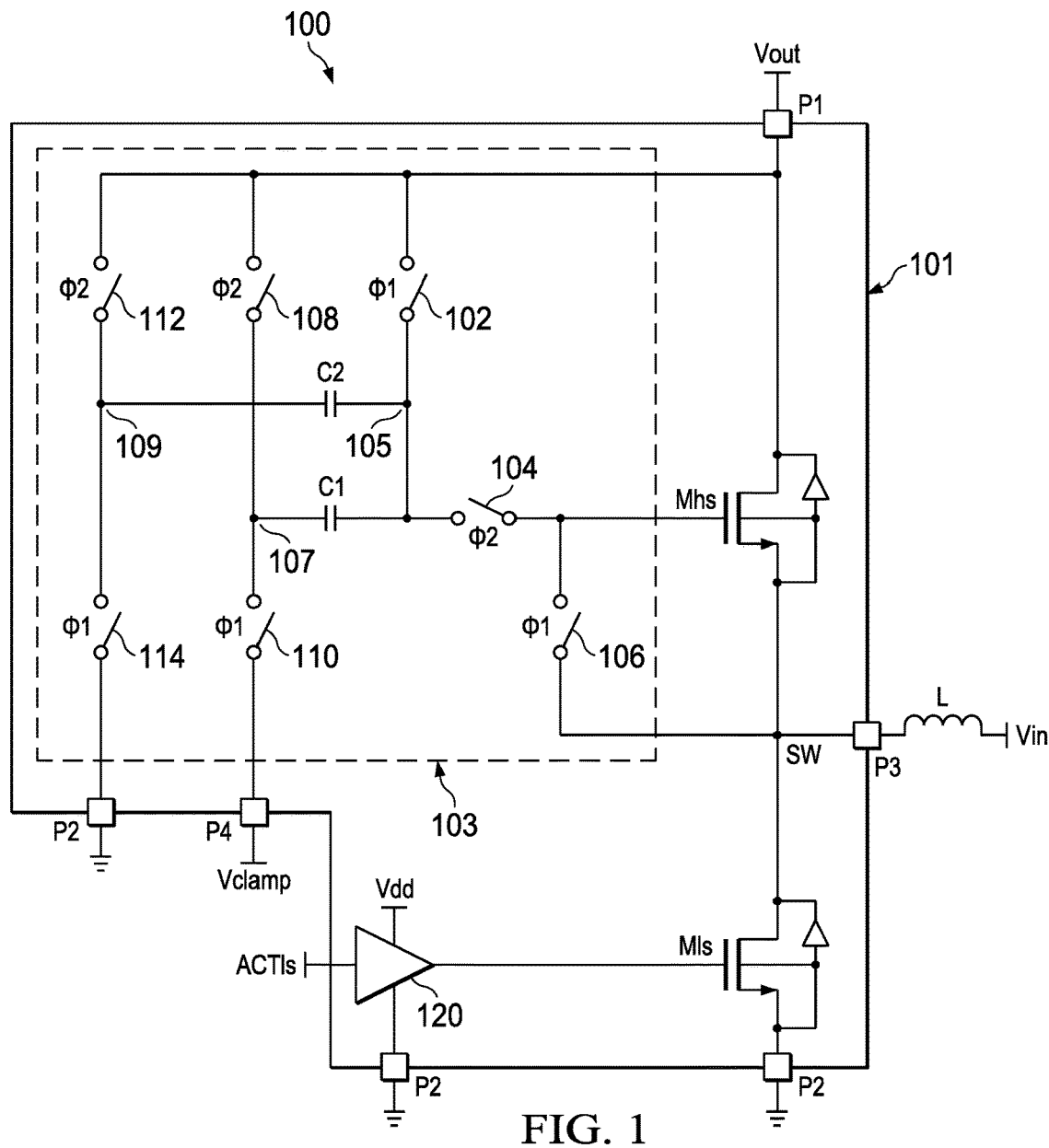
FIG. 1 depicts an example of a switched-mode DC/DC boost converter implemented in an integrated circuit chip according to an embodiment of the disclosure.

FIG. 1 depicts a DC/DC boost converter 100 that is implemented on IC chip 101 and has an output voltage of up to 10 V. DC/DC boost converter 100 includes high-side NMOS power transistor Mhs and low-side NMOS power transistor Mls, which are coupled in series between an output pin P1 for coupling to an output voltage Vout and a ground pin P2 for coupling to the lower rail, and has a switch-node SW located between high-side NMOS power transistor Mhs and low-side NMOS power transistor Mls. Switch node SW is coupled to an input pin P3, which during operation of DC/DC boost converter 100 is coupled to inductor L and through inductor L to input voltage Vin.

High-side NMOS power transistor Mhs is controlled by gate driver 103, which includes first bootstrap capacitor C1, second bootstrap capacitor C2 and seven switches 102-114; low-side gate driver 120 is coupled between a voltage Vdd and the lower rail and receives activate-low-side signal ACTls. As was done in FIG. 9, the phase in which each of switches 102-114 is coupled to be closed is shown in FIG. 1. Both first bootstrap capacitor C1 and second bootstrap capacitor C2 are on-chip capacitors, although their construction is on different levels of the chip, as will be demonstrated below. First bootstrap capacitor C1 is again limited in the voltage it can handle and can be coupled to clamping voltage Vclamp via clamp pin P4, while second bootstrap capacitor C2 can handle the full output voltage Vout across the plates and is coupled to the lower rail through ground pin P2. It can be noted that three ground pins P2 are illustrated in FIG. 1. It will be understood that in power circuits, the actual number of pins coupled to high-current pins can vary according to the needs and design of the circuit and that these illustrations are not to be taken as limitations. In one embodiment, clamping voltage Vclamp is 5 V. A first terminal of each of first bootstrap capacitor C1 and second bootstrap capacitor C2 is coupled to a first node 105.

With regard to the switching circuitry of gate driver 103, first switch 102 is coupled in series with a second switch 104 between output pin P1 and the gate of the high-side NMOS power transistor Mhs, with first node 105 being located between first switch 102 and second switch 104. A third switch 106 is coupled between the gate of high-side NMOS power transistor Mhs and switch-node SW. Fourth switch 108 is coupled in series with a fifth switch 110 between output pin P1 and clamping voltage Vclamp, with a second terminal of first bootstrap capacitor C1 being coupled to a second node 107 that is between fourth switch 108 and fifth switch 110. Sixth switch 112 is coupled in series with seventh switch 114 between output pin P1 and the lower rail, which in one embodiment is the ground plane, with a second terminal of second bootstrap capacitor C2 being coupled to a third node 109 between sixth switch 112 and seventh switch 114.

Figure 2A:
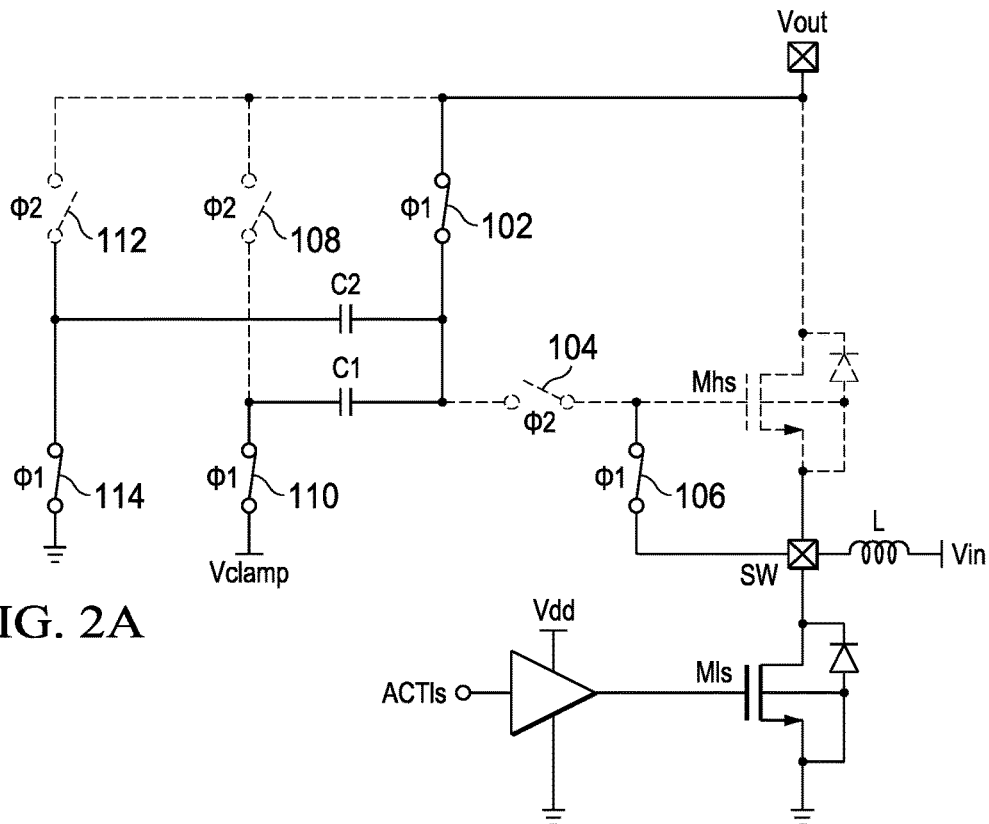
FIGS. 2A and 2B depict the position of the switches of FIG. 1 during two phases of operation according to an embodiment of the disclosure.

Operation of switches 102-114 again occurs in two distinct phases, which are explained with reference to FIGS. 2A and 2B. In discussing the operation of the circuit, transistors, switches and pathways that are not active are shown as dotted lines, while active transistors, switches and pathways are shown as solid lines. During a first phase Φ1 shown in FIG. 2A, first switch 102, third switch 106, fifth switch 110 and seventh switch 114 are closed and second switch 104, fourth switch 108 and sixth switch 112 are open. During the first phase Φ1, first bootstrap capacitor C1 is coupled between output pin P1 and clamp pin P4 to charge the first bootstrap capacitor C1 to a first bootstrap voltage Vboot1 that is equal to (Vout−Vclamp) and second bootstrap capacitor C2 is coupled between output pin P1 and the lower rail to charge second bootstrap capacitor C2 to a second bootstrap voltage Vboot2 that is equal to output voltage Vout. While first bootstrap capacitor C1 and second bootstrap capacitor C2 are charging, third switch 106 couples the gate of high-side NMOS power transistor Mhs to the switch-node SW. Closing third switch 106 ensures that the gate and the source terminals of high-side NMOS power transistor Mhs are at the same potential and high-side NMOS power transistor Mhs is in an off state.

Figure 2B:
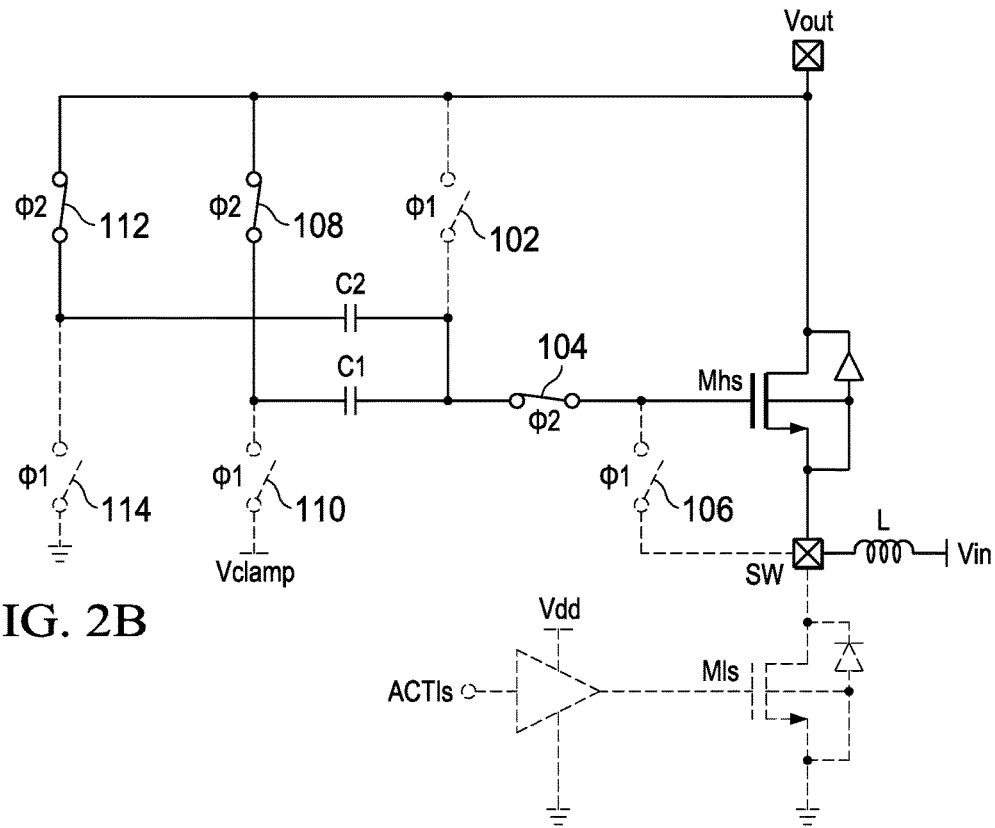

Then in second phase 12 shown in FIG. 2B, second switch 104, fourth switch 108 and sixth switch 112 are closed and first switch 102, third switch 106, fifth switch 110 and seventh switch 114 are opened. During second phase Φ2 low-side NMOS power transistor Mls is turned off. A current continues to flow through inductor L and begins to charge switch-node SW, which is now uncoupled from the gate of high-side NMOS power transistor Mhs. At the same time, respectively coupling the bottom plate (i.e., the plate having the lower voltage) of first bootstrap capacitor C1 and second bootstrap capacitor C2 to the output pin P1 and to output voltage Vout through fourth switch 108 and sixth switch 112 causes the voltage on the top plate of the capacitors to rise accordingly. The total charge accumulated during the first phase Φ1 is shared with the gate capacitor of high-side NMOS power transistor Mhs, creating a gate/source voltage and turning on the high-side NMOS power transistor Mhs.

Figure 3A:
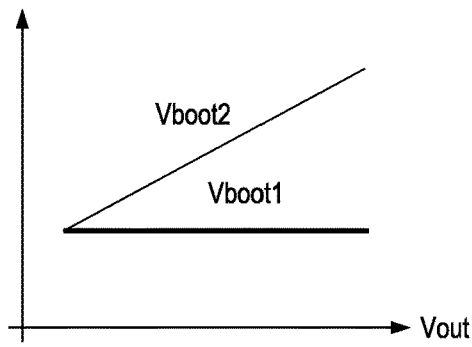
FIG. 3A depicts the voltages across the first and second bootstrap capacitors as the output voltage is increased according to an embodiment of the disclosure.
Figure 3B:
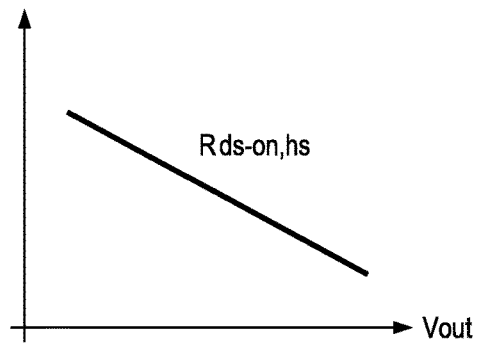
FIG. 3B depicts a graph of the Rds-on,hs as the output voltage is increased according to an embodiment of the disclosure.

FIG. 3A depicts the bootstrap voltages Vboot1 and Vboot2 as the value of output voltage Vout increases. As output voltage Vout increases, the clamping voltage Vclamp applied to the second terminal of bootstrap capacitor C1 is adjusted to ensure that first bootstrap voltage Vboot1 remains the same across all values of output voltage Vout. Second bootstrap capacitor C2 is powered by the output voltage Vout and the lower rail, e.g. the ground plane, so that second boot voltage Vboot2 rises in direct proportion to output voltage Vout. At the same time, as shown in FIG. 3B, the high-side drain/source on-resistance Rds-on,hs is inversely proportional to output voltage Vout and decreases as the output voltage increases. As a result, for lower values of output voltage Vout, operation of high-side NMOS power transistor Mhs has reduced switching losses due to the lower gate/source voltage Vgs, while at higher values of output voltage Vout, operation of high-side NMOS power transistor Mhs has reduced conduction losses due to higher overdrive that reduces drain/source on-resistance Rds-on,hs.

As shown, the DC/DC boost converter 100 includes two separate bootstrap capacitors that can be charged to different voltages, with the first bootstrap voltage Vboot1 that is contributed by first bootstrap capacitor C1 remaining constant and the second bootstrap voltage Vboot2 increasing in proportion to output voltage Vout. The charge sharing between first bootstrap capacitor C1 and second bootstrap capacitor C2 enables reduction of required capacitance for a single capacitor. Additionally, the DC/DC boost converter efficiency is improved by having one of the voltages, e.g. second bootstrap voltage Vboot2, dependent on the operating point of output voltage Vout. When DC/DC boost converter 100 is implemented in IC chip 101, second bootstrap capacitor C2 can be stacked in layout to achieve a significant area reduction.

Figure 4A:
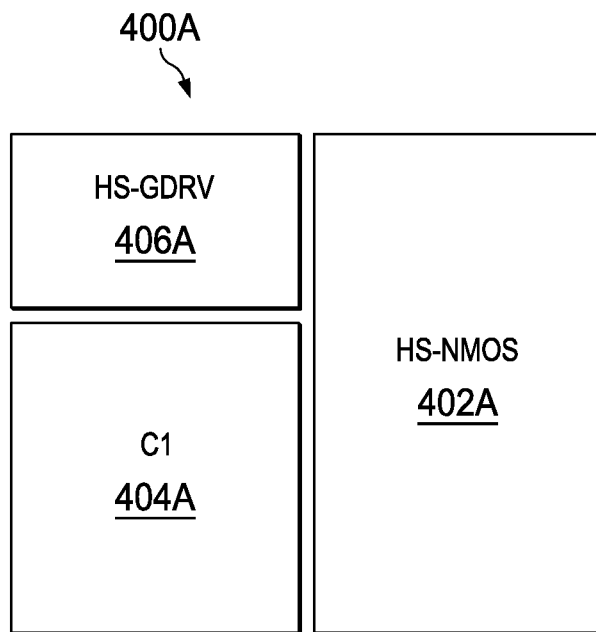
FIG. 4A depicts the relative areas consumed in implementing the high-side NMOS power transistor, the high-side gate drive switches and bootstrap capacitor C1 according to an implementation of the circuit of FIG. 9.

FIG. 4A depicts the relative amounts of real estate on an IC chip for the components of the high-side circuitry 400A for DC/DC boost converter 900. The high-side NMOS power transistor area HS-NMOS 402A consumes roughly half of the portion of the chip devoted to the high-side circuitry 400A. Of the remaining half of high-side circuitry 400A, C1 capacitor area 404A consumes roughly two thirds and the gate drive switches area HS_GDRV 406A consumes the remaining third.

Figure 4B:
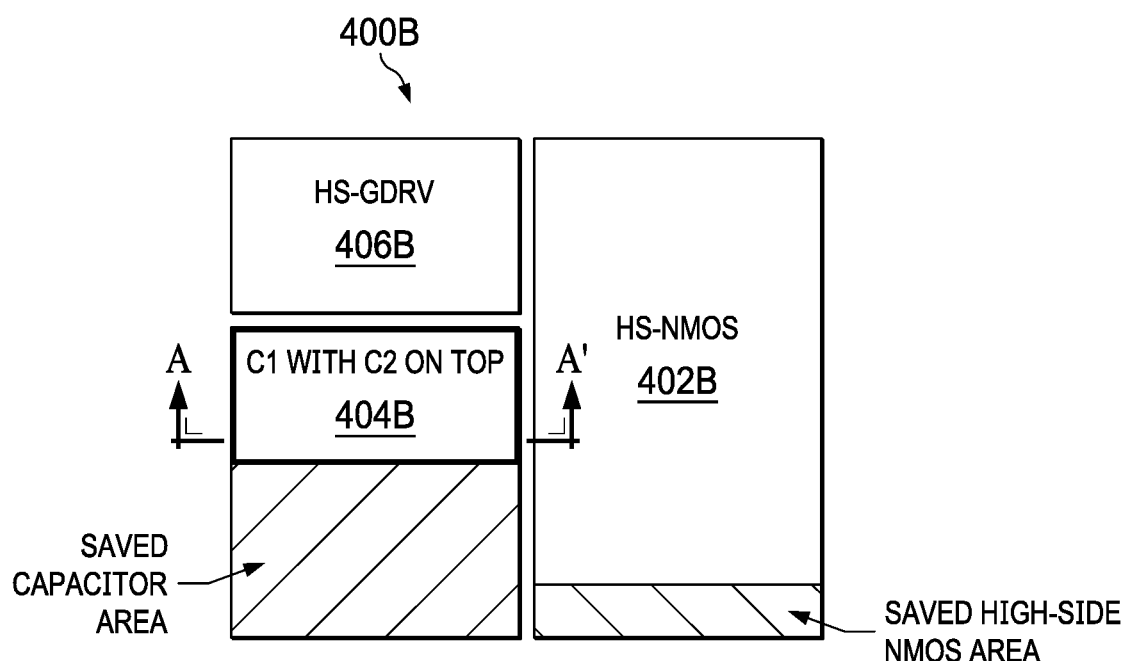
FIG. 4B depicts the relative areas consumed in implementing the high-side NMOS power transistor, the high-side gate drive switches and bootstrap capacitors C1/C2 according to an embodiment of the disclosure.

FIG. 4B depicts the relative amounts of real estate for the components of the high-side circuitry 400B for DC/DC boost converter 100. In the embodiment shown, the high-side NMOS power transistor area HS-NMOS 402B has been reduced by about 10%. This reduction in area is dependent on the capacitance ratio between first bootstrap capacitor C1 and second bootstrap capacitor C2, which affects how much the gate/source voltage of the high-side switch changes over the voltage range of Vout and will vary. The decrease in size of the on-chip capacitor area is even more significant. C1/C2 capacitor area 404B is less than half the size of C1 capacitor area 404A. It will be understood that simply by stacking two capacitors having the same capacitance, the area consumed for the capacitors can be halved. When a high-voltage capacitor, e.g., second bootstrap capacitor C2, is stacked over an existing capacitor having a constrained voltage, the reduction can be even greater. Again, the actual reduction in the real estate used by the capacitors depends on the capacitance ratio and is discussed below. The high-side gate drive switches area HS-GDRV 406B is essentially the same size as in the prior art, because the area added for new switches 112, 114 is comparable to the possible reduction of the sizes of switches for the first bootstrap capacitor C1 due to the sharing of currents with second bootstrap capacitor C2.

Figure 5:
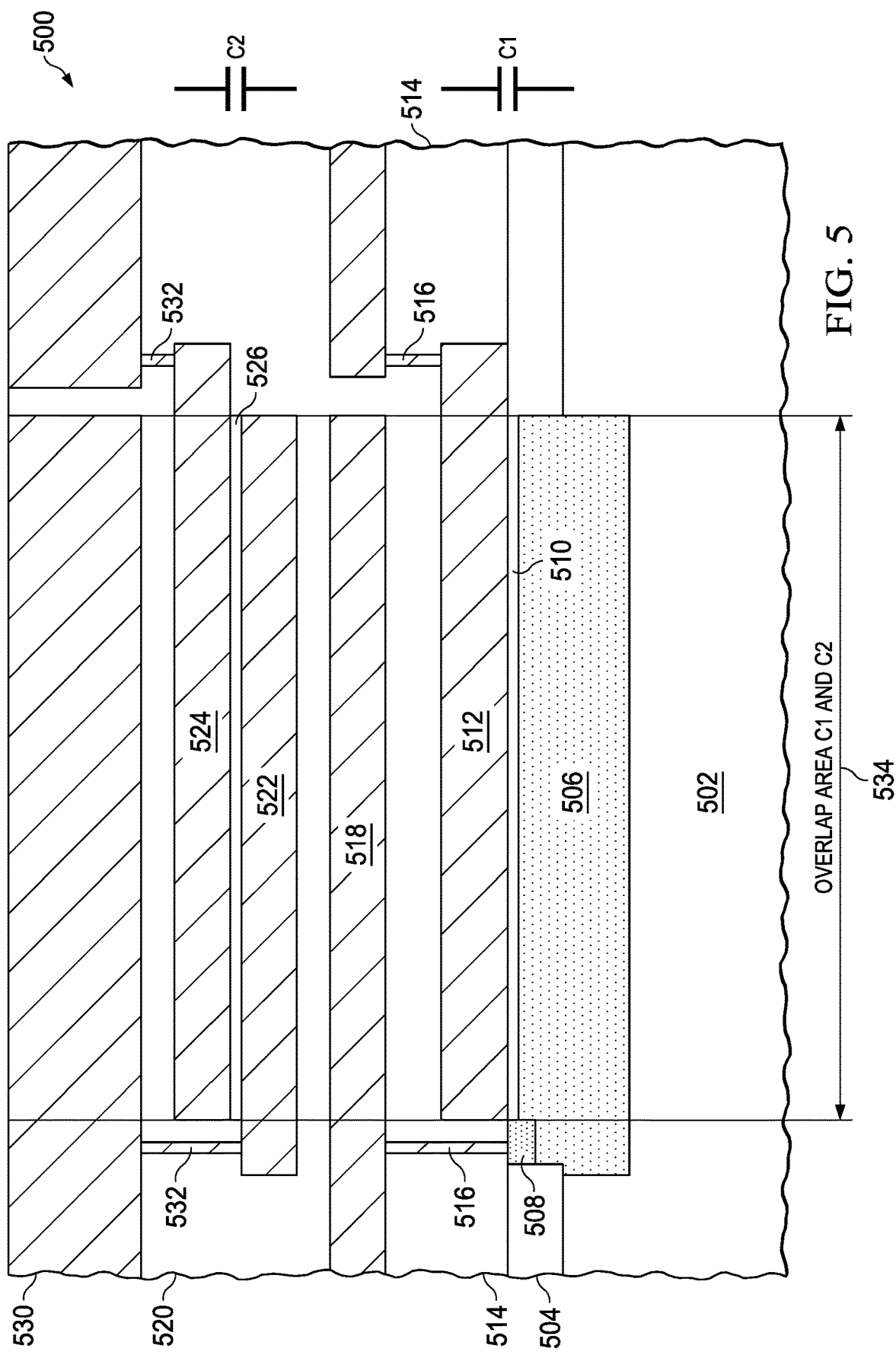
FIG. 5 depicts a cross-section along the line A-A' of FIG. 4B according to an embodiment of the disclosure.

FIG. 5 depicts a portion of IC chip 500 on which stacked bootstrap capacitors C1 and C2 are implemented and corresponds to a cross-section taken at line A-A' of FIG. 4B. As shown, second bootstrap capacitor C2 overlies first bootstrap capacitor C1 and has the same area as first bootstrap capacitor C1. While having the same area is not required in the disclosed embodiments, fabricating first bootstrap capacitor C1 and second bootstrap capacitor C2 with the same area provides the smallest area usage. Epitaxial layer 502 of IC chip 500 contains a thick layer of oxide 504, a doped well in the substrate of IC chip 500 that forms the lower plate 506 of first capacitor C1, and a contact region 508 for the lower plate 506. A layer of oxide overlies lower plate 506 and forms a capacitor dielectric 510 for first capacitor C1. In one embodiment, capacitor dielectric 510 is formed at the same time as the gate oxide for logic transistors on IC chip 500 are formed. A layer of polysilicon forms the upper plate 512 for first capacitor C1.

Dielectric layer 514 separates upper plate 512 from the lower metal routing stack 518, while vias 516 form connections between lower metal routing stack 518 and both contact region 508 and upper plate 512. Dielectric layer 520 separates lower metal routing stack 518 from second capacitor C2, which is formed of a lower plate 522 and an upper plate 524 that are separated by the C2 dielectric layer 526. The upper metal routing stack 530 is coupled to both upper plate 524 and lower plate 522 by respective vias 532. The overlap area between first capacitor C1 and second capacitor C2 is shown by arrows 534. Arrows 534 also depict the overlap between upper plate 524 and lower plate 522 of second capacitor C2, as well as the overlap between upper plate 512 and lower plate 506 of first capacitor C1.

The mathematics of the area reduction will now be demonstrated. The implementation of bootstrap capacitor C1 of FIG. 9 is fabricated in a manner similar to first capacitor C1 of FIG. 5 in which the first plate is a heavily doped polysilicon layer that is separated from a second plate formed in the substrate of a wafer by a gate oxide layer. For such a single 5 V bootstrap capacitor implementation, the total charge in a 5 V gate oxide capacitor C1 is expressed as:

$$Q1 = 5V \cdot C1 \quad \text{Equation 1}$$

where Q is the charge and C is the capacitance.

The gate-source voltage Vgs that results from charge redistribution between bootstrap capacitor C1 and the gate of high-side NMOS power transistor Mhs is shown by:

$$Vgs = \frac{Q1}{Ctotal} = \frac{Q1}{Cgg + C1} = \frac{5V \cdot C1}{Cgg + C1} \quad \text{Equation 2}$$

where Cgg is the effective gate capacitance of high-side NMOS power transistor Mhs.

Rearranging the equation to determine the bootstrap capacitance yields:

$$C1 = \frac{Vgs \cdot Cgg}{5V - Vgs} \quad \text{Equation 3}$$

Looking next at the disclosed stacked bootstrap capacitor implementation, the total charge in a 5 V gate oxide capacitor and a high-voltage capacitor charged to 10 V is expressed as:

$$Q1,2 = 5V \cdot C1 + 10V \cdot C2 \quad \text{Equation 4}$$

The gate-source voltage Vgs of the high-side NMOS power transistor resulting from charge redistribution between first bootstrap capacitor C1, second bootstrap capacitor C2 and the gate of high-side NMOS power transistor Mhs is:

$$Vgs = \frac{Q1,2}{Ctotal} = \frac{Q1,2}{Cgg + C1 + C2} = \frac{5V \cdot C1 + 10V \cdot C2}{Cgg + C1 + C2} \quad \text{Equation 5}$$

Assuming that the high-voltage capacitor has an 'r' times smaller capacitance as compared to that of a 5V gate oxide capacitor yields the following:

$$Vgs = \frac{5V \cdot C1 + 10V \cdot C2}{Cgg + C1 + C2} = \frac{C1 \cdot \left(5V + \frac{10V}{r}\right)}{Cgg + C1 \cdot \left(1 + \frac{1}{r}\right)} \quad \text{Equation 6}$$

Solving the equation for the bootstrap capacitance yields:

$$C1 = \frac{Vgs \cdot Cgg}{5V - Vs + \frac{1}{r} \cdot (10V - Vgs)} \quad \text{Equation 7}$$

Comparing the 5V gate oxide bootstrap capacitance values for the case when a single capacitor is used vs. the proposed stacked-capacitor implementation yields:

$$\frac{C1, \text{single}}{C1, \text{stacked}} = \frac{5V - Vgs + \frac{1}{r} \cdot (10V - Vgs)}{5V - Vgs} \quad \text{Equation 8}$$

Because second bootstrap capacitor C2 is stacked on top of first bootstrap capacitor C1, a reduction of 5V gate oxide capacitor C1 directly translates to an area reduction.

FIG. 6 depicts a graph 600 in which the Y-axis provides a ratio of the capacitor area when a single bootstrap capacitor is employed to the capacitor area when stacked bootstrap capacitors are utilized and the X-axis depicts the capacitance ratio r. It can be seen that as the capacitance ratio becomes larger, the area reduction becomes less. The embodiment of FIG. 1 was implemented at point 602 along the curve, in which the capacitance ratio plotted on the X-axis is 3 and the area reduction plotted on the Y-axis is 2.444 times.

FIG. 7 depicts a graph 700 that compares the overall boost converter efficiency of a single capacitor embodiment, shown by curve 702, and the overall boost converter efficiency of the stacked capacitor implementation of FIG. 1, shown by curve 704. The efficiency losses of a bootstrap capacitor include the high-side gate charge, which needs to be replenished every switching cycle, and capacitor isolation wells, which are tied to dynamically moving high-voltage nodes. The capacitor isolation wells are reduced by the proposed capacitor stacking implementation. Estimated efficiency curves are showing about a 4% improvement in the light load region that is dominated by switching losses.

Figure 8:
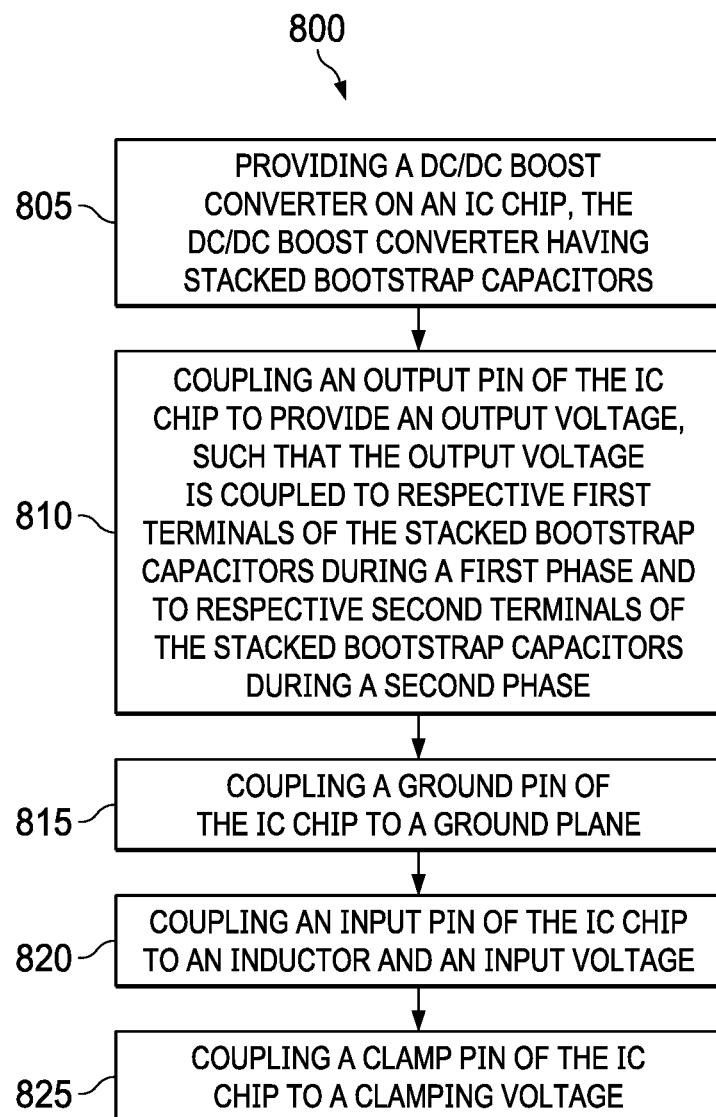
FIG. 8 depicts a flowchart of a method of operating a DC/DC boost converter according to an embodiment of the disclosure.

FIG. 8 depicts a flowchart for a method 800 of operating a DC/DC boost converter according to an embodiment of the disclosure. The method 800 begins with providing (805) a DC/DC boost converter on an IC chip, where the DC/DC boost converter has stacked bootstrap capacitors. The method continues with coupling (810) an output pin of the IC chip to provide an output voltage, such that the output voltage is coupled to respective first terminals of the stacked bootstrap capacitors during a first phase and to respective second terminals of the stacked bootstrap capacitors during a second phase. Further elements include coupling (815) a ground pin of the IC chip to a ground plane; coupling (820) an input pin of the IC chip to an inductor and an input voltage; and coupling (825) a clamp pin of the IC chip to a clamping voltage.

Applicants have disclosed a DC/DC boost converter with a high-side NMOS power transistor and a stacked bootstrap capacitor implementation that can demonstrate one or more of the following advantages: a reduction in the chip area for the high-side switch, a reduction in the chip area for the stacked capacitors, reduced switching losses and a dynamic on-resistance, the latter two of which are due to the dynamic bootstrap voltage of the second bootstrap capacitor. Applicants have also disclosed a method of operating the DC/DC boost converter.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A process of operating a switch mode DC/DC converter, the process comprising:
   (a) charging with a first charge a first bootstrap capacitor, having a first plate and a second plate, in a first phase of operation by coupling the first plate to an output voltage and coupling the second plate to a clamp voltage;
   (b) supplying the first charge from the first bootstrap capacitor to a control terminal of a high side transistor in a second phase of operation by coupling the first plate to the control terminal and coupling the second plate to the output voltage;
   (c) charging with a second charge a second bootstrap capacitor, having a first plate and a second plate, in the first phase by coupling the first plate of the second bootstrap capacitor to the output voltage and coupling the second plate of the second bootstrap capacitor to a ground node; and
   (d) in addition to supplying the first charge from the first bootstrap capacitor to the control terminal of the high side transistor in the second phase, supplying the second charge from the second boot strap capacitor to the control terminal of the high side transistor in the second phase by coupling the first plate of the second bootstrap capacitor to the control terminal and coupling the second plate of the second transistor to the output voltage.

2. The process of claim 1 including limiting a voltage on the first bootstrap capacitor to 5 volts.

3. The process of claim 1 including limiting a difference between the output voltage and the clamp voltage to 5 volts.

4. The process of claim 1 including coupling the control terminal of the high side transistor to the source of the high side transistor during the first phase.

5. The process of claim 1 including coupling a switch node to an output voltage node during the second phase by turning on the high side transistor with the charge from the first and second bootstrap capacitors.

6. The process of claim 5 including coupling an input voltage to the switch node through an inductor.

7. The process of claim 1 including coupling the switch node to the ground node through a drain and source of a low side transistor during the first phase.

8. The process of claim 7 includes receiving a driver output signal at a control terminal of the low side transistor.

9. The process of claim 8 including producing the driver output signal in response to receiving an activation signal.

10. The process of claim 1 including supplying charge from the first and second bootstrap capacitors that are formed to be overlapping one another in an integrated circuit.

11. The process of claim 10 including supplying the first charge from the first bootstrap capacitor that is below the second bootstrap capacitor.

12. The process of claim 1 including supplying charge from the first and second bootstrap capacitors that have equal overlap areas of the integrated circuit.

13. The process of claim 1 in which coupling the first plate of the first bootstrap capacitor and coupling the first plate of the second bootstrap capacitor to the output voltage node includes closing a first switch.

14. The process of claim 1 in which coupling the first plate of the first bootstrap capacitor and coupling the first plate of the second bootstrap capacitor to the control terminal includes closing a second switch.

15. The process of claim 1 including turning on the high side transistor to conduct current through the high side transistor from an inductor to the output voltage node in response to the supplying the first charge from the first bootstrap capacitors to the control terminal and supplying the second charge from the second bootstrap capacitor to the control terminal.

* * * * *